United States Patent
Hoogeveen

(10) Patent No.: US 8,324,899 B2
(45) Date of Patent: Dec. 4, 2012

(54) MR COIL WITH FIBER OPTICAL CONNECTION

(75) Inventor: Romhild Hoogeveen, Best (NL)

(73) Assignee: Koninklijke Philips Electronics N.V., Eindhoven (NL)

(*) Notice: Subject to any disclaimer, the term of this patent is extended or adjusted under 35 U.S.C. 154(b) by 755 days.

(21) Appl. No.: 12/088,241

(22) PCT Filed: Sep. 14, 2006

(86) PCT No.: PCT/IB2006/053290
§ 371 (c)(1),
(2), (4) Date: Aug. 13, 2008

(87) PCT Pub. No.: WO2007/039842
PCT Pub. Date: Apr. 12, 2007

(65) Prior Publication Data
US 2009/0030305 A1    Jan. 29, 2009

Related U.S. Application Data

(60) Provisional application No. 60/724,333, filed on Oct. 6, 2005.

(51) Int. Cl.
*G01V 3/00* (2006.01)
(52) U.S. Cl. ........................ 324/318; 324/322
(58) Field of Classification Search .................. 324/318, 324/322
See application file for complete search history.

(56) References Cited

U.S. PATENT DOCUMENTS

| | | | |
|---|---|---|---|
| 5,059,906 A | 10/1991 | Yamanaka | |
| 5,065,760 A | 11/1991 | Krause et al. | |
| 5,545,999 A | 8/1996 | Mueller et al. | |
| 5,548,676 A * | 8/1996 | Savage, Jr. | 385/92 |
| 5,550,471 A | 8/1996 | Feld | |
| 6,317,619 B1 * | 11/2001 | Boernert et al. | 600/410 |
| 6,362,622 B1 * | 3/2002 | Stauber et al. | 324/318 |
| 6,925,322 B2 * | 8/2005 | Helfer et al. | 600/423 |
| 7,345,485 B2 * | 3/2008 | Jevtic et al. | 324/322 |
| 2003/0206019 A1 | 11/2003 | Boskamp | |
| 2004/0019273 A1 | 1/2004 | Helfer et al. | |

FOREIGN PATENT DOCUMENTS

| | | |
|---|---|---|
| JP | 01223943 A | 7/1989 |
| JP | 05237078 A | 9/1993 |
| WO | 02086526 A1 | 10/2002 |
| WO | 03054567 A2 | 7/2003 |
| WO | 2004089211 A2 | 10/2004 |

* cited by examiner

Primary Examiner — Louis M. Arana

(57) ABSTRACT

An MRI coil system (34) comprises a local RF coil assembly (36) which includes one or more RF coil elements (38). An electronic circuit (88) is operatively connected to the RF coil elements (38), which electronic circuit (88) at least converts electrical signals into optical signals. A first connector (112) is in operative communication with the electronic circuit (88). A detachable cable (40) includes a second connector (120), which selectively mates with the first connector (112) and connects the coil elements (38) and the electronic circuit to an external device.

17 Claims, 4 Drawing Sheets

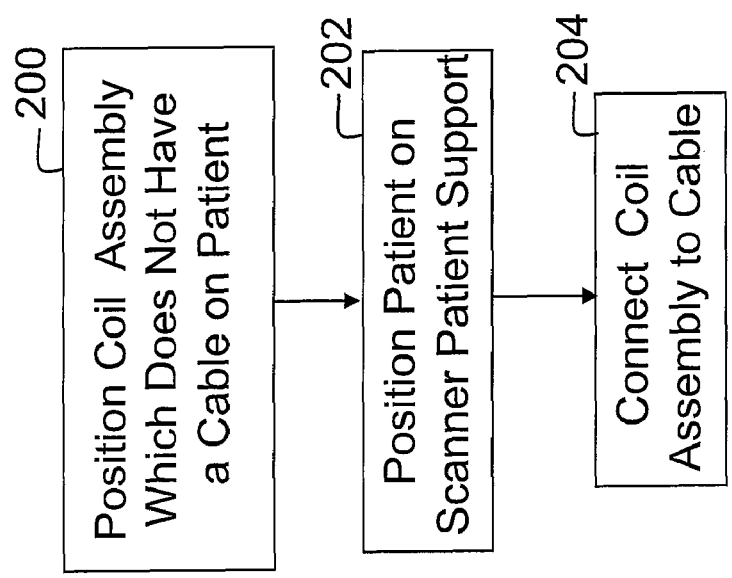

MR COIL WITH FIBER OPTICAL CONNECTION

CROSS REFERENCE TO RELATED APPLICATIONS

Figure 1:
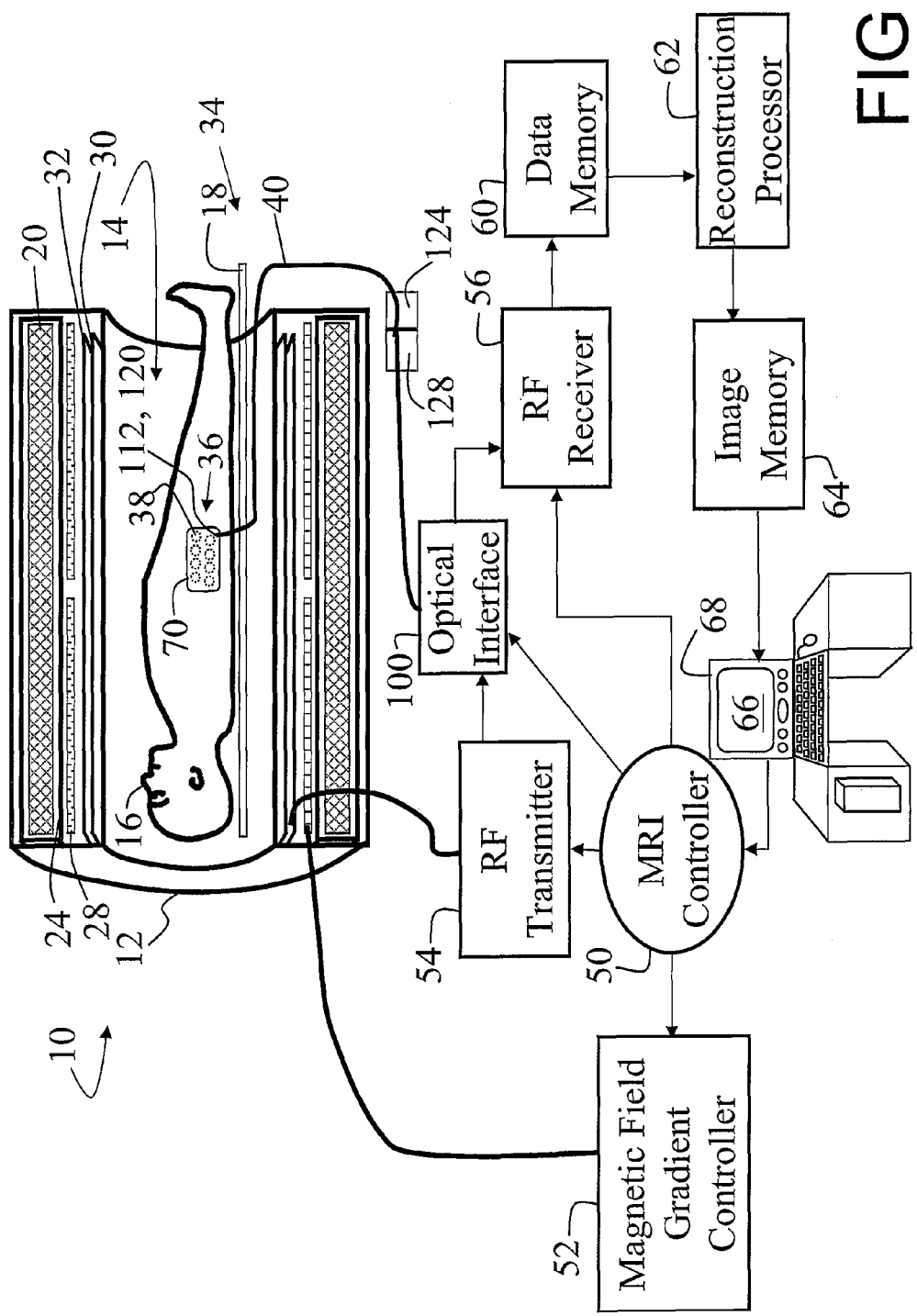

This application claims the benefit of U.S. provisional application Ser. No. 60/724,333 filed Oct. 6, 2005, which is incorporated herein by reference.

The following relates to the magnetic resonance arts. It finds particular application in conjunction with local coils for medical magnetic resonance imaging systems and will be described with particular reference thereto. It is to be appreciated, however, that the following may also find application in conjunction with other types of magnetic resonance systems, magnetic resonance spectroscopy systems, and the like.

In magnetic resonance imaging, a substantially uniform main magnetic field is generated within an examination region. The main magnetic field polarizes the nuclear spin system of a subject being imaged within the examination region. Magnetic resonance is excited in dipoles which align with the main magnetic field by transmitting radio frequency excitation signals into the examination region. Specifically, radio frequency pulses transmitted via a radio frequency coil assembly tip the dipoles out of alignment with the main magnetic field and cause a macroscopic magnetic moment vector to process around an axis parallel to the main magnetic field. The processing magnetic moment, in turn, generates a corresponding radio frequency magnetic signal as it relaxes and returns to its former state of alignment with the main magnetic field. The radio frequency magnetic resonance signal is received by the radio frequency coil assembly, and from the received signals, an image representation is reconstructed for display on a human viewable display.

Generally, the RF coil assembly of an MRI system includes a transmit coil to create the $B_1$ field and often includes a separate, local receive coil used in conjunction with the transmit coil to detect or receive the signals from the excited spins in the imaged object. Typically, each local coil of the RF coil assembly is connected to the receive and/or transmit channels of the MRI system via a wire line in the connecting cable. Additionally, the local coils of the RF coil assembly are typically supplied power through a series of lines in the connecting cable. Typically, the connecting cable is affixed to the coil.

During the procedure preparation stage, the patient is positioned on the patient couch of the scanner. The medical personal positions the local coil with the cable on the patient. The cable is then extended from the coil to a corresponding socket where a cable connector is plugged in. The cable is typically heavy as it carries power, signal and ground wire lines and corresponding shields. In some cases, the cable is long. The connector terminates the cable on its free end and, of itself, is bulky and heavy as the connector provides connections to many wires. Such procedure is cumbersome for patients and decreases throughput of the medical imaging system, especially when several coils are used to image different parts of the patient's body.

The following contemplates improved apparatuses and methods that overcome the aforementioned limitations and others.

According to one aspect, an MRI coil system is disclosed. A local RF coil assembly includes one or more RF coil elements. An electronic circuit is operatively connected to the RF coil elements, which electronic circuit at least converts electrical signals into optical signals. A first connector is in operative communication with the electronic circuit. A detachable cable includes a second connector which selectively mates with the first connector and connects the coil elements and the electronic circuit to an external device.

According to another aspect, an imaging method is disclosed. A coil assembly is positioned and secured on a patient. The coil assembly includes one or more RF coil elements and a first connector in operative communication with the coil element. The patient is positioned on a patient support of an MRI scanner. The coil assembly is connected with a coil cable via the first connector and a mating second connector disposed at the coil cable.

One advantage resides in improved patient throughput.

Numerous additional advantages and benefits will become apparent to those of ordinary skill in the art upon reading the following detailed description.

The invention may take form in various components and arrangements of components, and in various process operations and arrangements of process operations. The drawings are only for the purpose of illustrating preferred embodiments and are not to be construed as limiting the invention.

Figure 2:
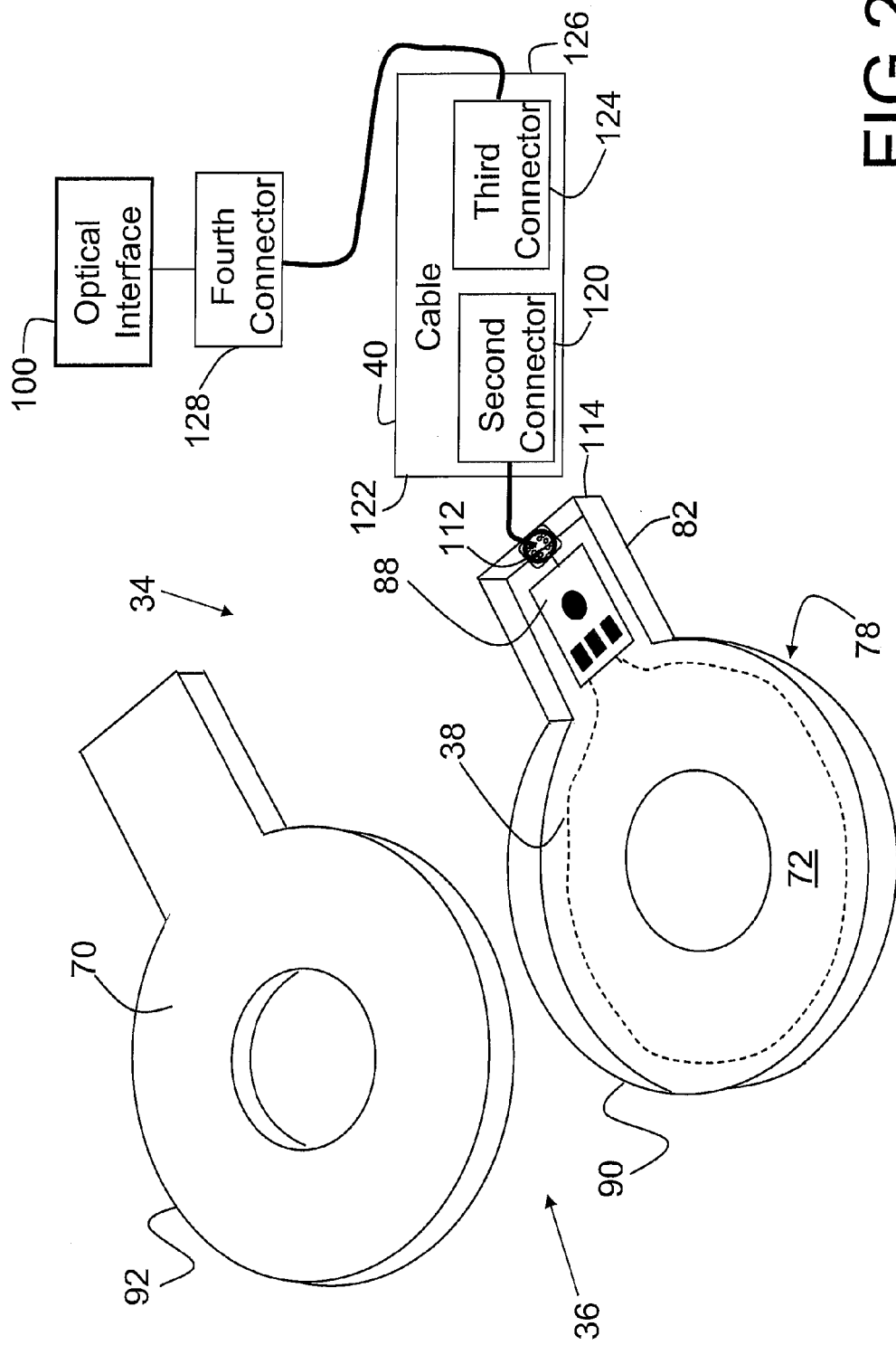
Figure 3:
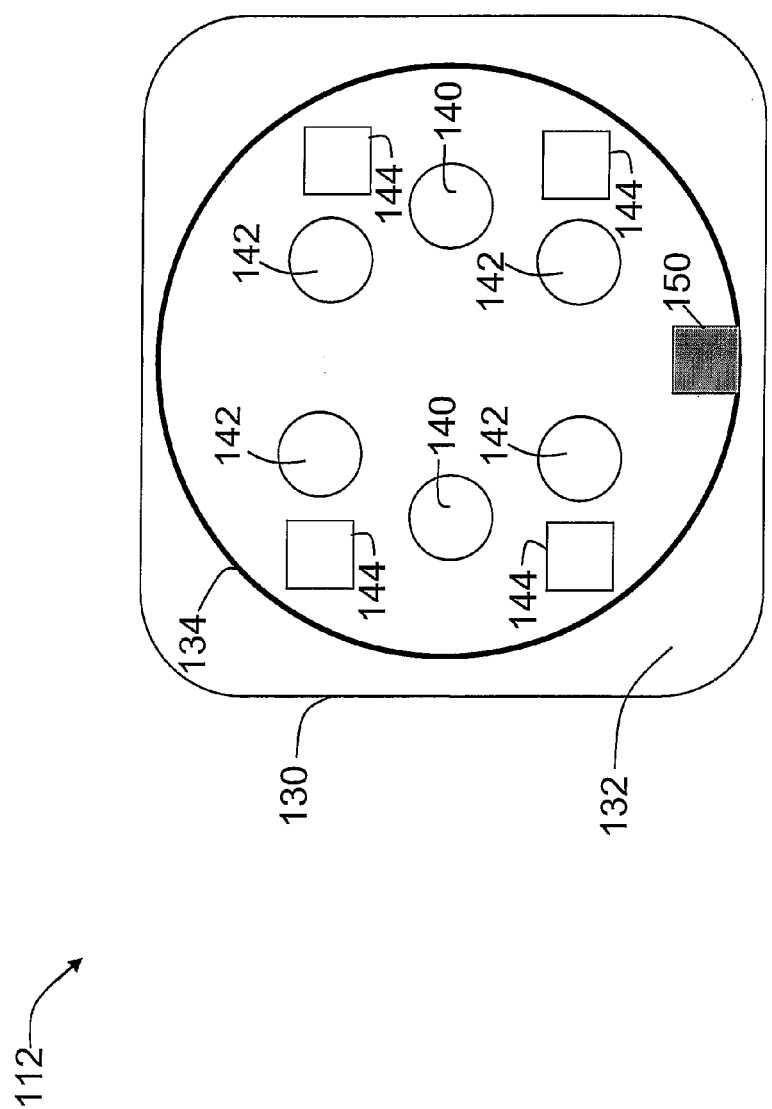

FIG. 1 diagrammatically shows a magnetic resonance imaging system employing a local radio frequency coil;

FIG. 2 shows an expanded view of a coil assembly and a portion of the magnetic resonance imaging system;

FIG. 3 diagrammatically shows a connector; and

FIG. 4 is a block diagram which shows a coil connection method.

With reference to FIG. 1, a magnetic resonance imaging scanner 10 includes a housing 12 defining an examination region 14, in which a patient or other imaging subject 16 is positioned on a patient support 18. A main magnet 20 disposed in the housing 12 generates a substantially spatially and temporally constant main magnetic field in the examination region 14. Typically, the main magnet 20 is a superconducting magnet surrounded by cryoshrouding 24; however, a resistive main magnet can also be used. Magnetic field gradient coils 28 are arranged in or on the housing 12 to superimpose selected magnetic field gradients on the main magnetic field within the examination region 14. Typically, the magnetic field gradient coils 28 include a plurality of coils for generating magnetic field gradients in a selected direction and at a selected gradient strength within the examination region 14. For example, the gradient coils 28 may include x-, y-, and z-gradient coils that cooperatively produce the selected magnetic field gradient in any selected direction.

A whole-body radio frequency coil 30, such as a stripline coil, disposed on an insulating dielectric former with a surrounding RF shield 32, a birdcage coil with rigid conductive rungs and rings, or the like, is arranged in or on the housing 12 to inject radio frequency excitation pulses into the examination region 14 and to detect generated magnetic resonance signals. For generating images of limited regions of the subject 16, a coil arrangement or system 34 is used which includes one or more local RF coil assemblies 36, each including one or more RF coil elements 38, which are placed contiguous to the selected region. The local coil arrangement 34 includes a detachable cable 40 as discussed in detail below. Although a bore-type magnet is illustrated, it is to be appreciated that open magnets are also contemplated.

A magnetic resonance imaging (MRI) controller 50 executes a selected magnetic resonance imaging sequence. The controller 50 operates magnetic field gradient controllers 52 coupled to the gradient coils 28 to superimpose selected magnetic field gradients on the main magnetic field in the examination region 14, and operates a radio frequency transmitter 54 coupled to the radio frequency coil 30 as shown, or to the local coil 36, surface coil, coils array, or so forth, to inject selected radio frequency excitation pulses at about the magnetic resonance frequency into the examination region 14. For two-dimensional imaging, the radio frequency excitation also includes a concurrent slice-selective magnetic field gradient imposed by the gradient system 28, 52.

The radio frequency excitation pulses excite magnetic resonance signals in the imaging subject 16 that are spatially radially encoded by applying a magnetic field gradient in a selected direction and with a selected gradient strength in accordance with the selected magnetic resonance imaging sequence. The imaging controller 50 operates a radio frequency receiver 56 connected with the radio frequency coils 38 (or 30) in accordance with the selected magnetic resonance imaging sequence to receive the radial readout magnetic resonance signals, and the received radial readout data are stored in a data memory 60.

A reconstruction processor 62 reconstructs the data into a 3D image representation by applying a fast Fourier transform or other appropriate reconstruction algorithms. The reconstructed image is stored in an image memory 64, and can be displayed on a user interface 66 of a workstation 68, transmitted over a local area network or the Internet, printed by a printer, or otherwise utilized. In the illustrated embodiment, the user interface 66 also enables a radiologist or other user to interface with the imaging controller 50. In other embodiments, separate user interfaces are provided for operating the scanner 10 and for displaying or otherwise manipulating the reconstructed images.

With continuing reference to FIG. 1 and further reference to FIG. 2, the coil local assembly 36 in a rigid embodiment includes an enclosure or case or support element 70, in which the active RF coil element or coil 38 is secured. More specifically, the coil element 38 is looped and securely fastened in a hollow cavity 72 of a lower ring half 78. The lower ring half section 78 is connected to an associated lower half shaft portion 82, which houses appropriate electronics or electronic assembly or circuit 88 such as a printed circuit board, which includes a tuning and matching circuitry. In one embodiment, the electronic assembly 88 includes an electro-optic transducer for connecting electrical resonance signals with optical signals. Associated lower and upper case halves 90, 92 are assembled to form the integral case 70. The case 70, for example, is constructed from a polycarbonate material, a plastic, and other like materials which, in one embodiment, meet the biotoxicity requirements of interventional products. Although only one coil element 38 is illustrated, it is contemplated that two, three, four or more coil elements can be utilized. In a flexible embodiment, the coil 38 is formed of flexible conductors on a flexible substrate. The electronic assembly 88 is mounted on the substrate, preferably in a grounded or shielded case. Various combinations of rigid and flexible local coils are contemplated.

With continuing reference to FIGS. 1 and 2, an optical interface 100 is connected to the receiver 56, the transmitter 54, and the controller 50 of the magnetic resonance scanner 10. The optical interface 100 converts the electrical command and control signals into optical signals and transmits the optical signals to the coil assembly 36. The optical interface 100 also converts the optical signals received from the coil assembly 36 into electrical signals suitable for the receiver 56. A first or coil connector 112 is disposed at a proximal end 114 of the coil assembly 36. A mating second or coil end cable connector 120 is disposed at a first or coil end 122 of the cable 40 to connect or mate with the first connector 112 disposed at the coil assembly 36. For example, the first connector 112 is a male connector, while the second connector 120 is a female connector. A third connector 124 is disposed at a second or scanner end 126 of the cable 40 to connect or mate with a fourth connector 128 disposed on the patient support 18, the housing 12, or elsewhere in the examination room. For example, the third connector 124 is a male connector, while the fourth connector 128 is a female connector. Of course, each connector may include a combination of male and female connection elements. In this manner, the second and third connectors 120, 124 are constructed to allow the cable 40 to be detached from the coil assembly 36 and the scanner 10.

The cable 40 includes one or more fiber optical strands suitable for transmitting optical signals to and from the coil assembly 36. In addition, the cable 40 may include DC power lines to provide electrical power to any active elements in the coil electronic assembly 88. The cable can also include electrical lines for carrying control or RF signals to or from the coil. If the cable includes electric lines, it also includes an RF shield. Such cable allows miniaturization of the coil connector 112 which can be directly attached to the coil case 70.

The electronic assembly 88 provides the means for converting the electrical signals from the coil elements 38 into optical signals and to transmit the optical signals through the fiber optic cable 40 to the optical interface 100. Additionally, the electronic assembly 88 receives optical command/gating signals, which originate as electrical signals at the transmitter 54 or the MRI controller 50 and are converted to the optical signals by the optical interface 100, which also converts optical signals into electrical signals. The command/gating signals are used by the electronic assembly 88, for example, to select which of several coils 38 is to be utilized for a particular application, tune and/or detune the coils 38, and the like.

With reference to FIG. 3, an exemplary first or coil connector 112 includes a holder 130 having a planar surface 132. A connecting facet 134 slides into the mating second connector 120 of the cable 40. In one embodiment, the first connector 112 is a male connector. The surface 132 includes transmit optic connectors or pins 140 which are used to send transmit or control signals from the transmitter 54 or controller 50 to the coil element 38. Receive optical connectors or pins 142 are used to send the signals from the coil element 38 to the receiver 56. Optionally, the coil connector 112 includes galvanic power connections or pins 144 to provide power to the electronics 88 and to ground a cable shield. The second connector 120 of the cable 40 is a mating female connector. In another embodiment, the first connector 112 is a female connector. The planar surface includes the transmit or control connections or tunnels 140 which receive corresponding plug elements and are used to send signals from the transmitter 56 or controller 50 to the coil element 38. The receive connections or tunnels 142 are used to send the signals from the coil element 38 to the receiver 56. Optionally, the coil connector 112 includes galvanic power tunnels 144 to provide power to the electronics 88. The second connector 120 of the cable 40 is a mating male connector. As illustrated, in the embodiment of FIG. 3, the coil connector 112 includes two transmit or control signal connections 140, four receive connections 142, and four power connections 144. Of course, it is contemplated that the number of the transmit and receive control connections can vary for particular design considerations. If the DC power lines are not included, the power to the electronics 88 is optionally provided via a battery. Optical fibers (not shown) are embedded in the holder 130 and terminate in optical interfaces corresponding transmit and receive connections. An alignment or guiding pin or notch 150 is disposed in a bottom part of the connecting facet and provides guidance for mating of the first and second connectors 112, 120.

With reference to FIG. 4, the coil assembly 36 which does not have an affixed cable is positioned on and accurately aligned with a region to be imaged. The coil is secured in place, e.g. with tape, straps, elastic wrap, or the like. In one embodiment, the coil assembly 36 which does not have a cable is positioned on the patient 200 in the pre-examination room to increase the throughput of the clinic. The patient with the pre-positioned coil is moved or, in some instances walks, into the examination room and is positioned 202 on the patient support 18. After positioning the patient, the cable 40 is connected 204 at one end with a plug or socket on the patient support, gantry or the like and at its other end with the local coil assembly 36.

The described above coil arrangement 34, with the detachable cable 40, opens the way to put the coil, such as wearable coil, on the patient before the patient enters the MR room. The patient does not have to carry heavy cable attached to the coil which, if mishandled, could shift the coil or damage the interface between the coil and the cable. The present, detachable cable coil arrangement is easy to use, provides more comfort to the patient, facilitates cost savings, e.g. one cable per system, and allows connecting multiple coils simultaneously.

The invention has been described with reference to the preferred embodiments. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A system comprising:
   a local RF coil assembly including:
      one or more RF coil elements,
      an electronic circuit operatively connected to the RF coil elements, which electronic circuit at least converts electrical MR signals into optical MR signals and converts optical control signals to electrical control signals, and
      a first connector having a first MR optical connection in operative communication with the electronic circuit to output the optical MR signals and a first control optical connection in communication with the electronic circuit which receives the optical control signals; and
   a detachable cable which includes:
      at least one MR optical fiber for carrying the optical MR signal from the local RF coil,
      at least one control optical fiber for carrying the optical control signal to the local RF coil, and
      a second connector which selectively mates with the first connector and connects the coil elements and the electronic circuit to an external device, the second connector including a second MR optical connection which optically couples the at least one MR optical fiber to the first MR optical connection and a second control optical connection which optically couples the at least one control optical fiber with the first control optical connection.

2. The coil system as set forth in claim 1, wherein the cable further includes a galvanic ground lead, the first connector includes a first ground galvanic connection connected with the electronic circuit, and the second connector includes a second ground galvanic connection connected with the galvanic ground lead, the first and second ground galvanic connections providing a ground galvanic connection across the second connector and the first connector when the first and second connectors are mated to provide a ground to the electronic circuit.

3. The coil system as set forth in claim 1, wherein the local coil assembly includes a plurality of coil elements, the first and second connectors each include a plurality of MR optical connections.

4. The coil system as set forth in claim 1, wherein the electronic circuit includes matching and tuning circuitry.

5. The coil system as set forth in claim 1, wherein the cable includes power leads, the first connector includes a power galvanic connection connected with the electronic circuit to provide electric power thereto and the second connector includes second power galvanic connections connected with the power leads, the first and second power galvanic connections providing power galvanicly across the first and second connectors when the first and second connectors are mated.

6. The coil system as set forth in claim 5, further including:
   a radio frequency transmitter which transmits selected radio frequency pulses to the coil element via the cable and the first and second connectors.

7. The coil system as set forth in claim 1, further including:
   a support element, which supports the one or more coil elements, the electronic circuit, and the first connector.

8. The system as set forth in claim 1, further including:
   a main magnet for generating a main magnetic field in a spatial region of interest;
   magnetic field gradient coils for superimposing selected magnetic field gradients on the main magnetic field in the spatial region of interest;
   the local RF coil assembly being attached to a patient and disposed in the spatial region of interest during magnetic resonance imaging.

9. An imaging method, comprising:
   positioning and securing a local RF coil assembly on a patient remote from an MR scanner, the local RF coil assembly including:
      one or more RF coil elements,
      an electronic circuit operatively connected to the RF coil elements, which electronic circuit at least converts electrical signals into optical signals, and
      a first connector in operative communication with the coil element;
   positioning the patient on a patient support of an MRI scanner; and
   at the MR scanners, connecting the local RF coil assembly positioned and secured on the patient with a detachable cable which includes a second connector which selectively mates with the first connector by connecting the first and second connectors to connect the coil elements and the electronic circuit to an external device.

10. The method as set forth in claim 9, further including:
    before performing the magnetic resonance scan and after positioning the patient on the patient support, connecting the cable with the local RF coil assembly by connecting the first and second connectors.

11. The method as set forth in claim 9, wherein the detachable cable includes optical fibers and further including during the magnetic scan:
    with the electric circuit, converting magnetic resonance signals received by the RF coil elements to optical output signals; and
    optically transmitting the optical output signals from the coil assembly over the optical fibers.

12. The method as set forth in claim 9, further including:
with the electronic circuit, converting radio frequency pulses received by the one or more RF coil elements into the optical signals; and
communicating the optical signals through the first and second connectors and the detachable coil cable.

13. The method as set forth in claim 12, further including:
at the MRI scanner, receiving the optical output signals from the cable;
converting the output signals into electrical resonance data; and
reconstructing the electrical resonance data into an image representation.

14. An imaging method, comprising:
positioning and securing the local RF coil assembly on a patient at a location remote from an MR scanner, the coil assembly including:
one or more RF coil elements,
an electronic circuit operatively connected to the RF coil elements, which electronic circuit at least converts electrical signals into optical signals, and
a first connector in operative communication with the electronic circuit;
positioning the patient on a patient support of the MR scanner; and
after positioning the patient on the patient support, connecting the local RF coil assembly with a detachable cable which includes a second connector which selectively optically couples with the first connector and optically connects the coil elements and the electronic circuit to an external device by connecting the second connector with the mating first connector.

15. The method as set forth in claim 14, further including:
generating control signals;
converting the control signals into the optical signals; and
communicating the optical signals over the detachable cable and through the first and second connectors to the local RF coil assembly.

16. The method as set forth in claim 14, wherein the first and second connectors include a plurality of optically mating female and male plug and socket connections and wherein the connecting step includes:
plugging the first and second connectors together to optically connect the coil assembly and the detachable cable while the patient is on the patient support of the MRI scanner.

17. The method as set forth in claim 16, wherein the first and second connectors further include galvanically mating female and male plug and socket connections and the connecting step includes:
plugging the first and second connectors together to optically and galvanically connect the coil assembly and the detachable cable while the patient is on the patient support of the MR scanner.

* * * * *